(12) United States Patent
Hu

(10) Patent No.: US 12,372,991 B2
(45) Date of Patent: Jul. 29, 2025

(54) IMPEDANCE-TRACKING CIRCUIT

(71) Applicant: Richtek Technology Corporation, Zhubei (TW)

(72) Inventor: Min-Hung Hu, New Taipei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 369 days.

(21) Appl. No.: 18/145,280

(22) Filed: Dec. 22, 2022

(65) Prior Publication Data

US 2023/0205247 A1 Jun. 29, 2023

Related U.S. Application Data

(60) Provisional application No. 63/293,686, filed on Dec. 24, 2021.

(30) Foreign Application Priority Data

Nov. 16, 2022 (TW) .................................. 111143741

(51) Int. Cl.
*G05F 1/575* (2006.01)
*G05F 1/565* (2006.01)
*H03F 3/45* (2006.01)

(52) U.S. Cl.
CPC .............. *G05F 1/575* (2013.01); *G05F 1/565* (2013.01); *H03F 3/45179* (2013.01)

(58) Field of Classification Search
CPC . G05F 1/63; G05F 1/652; G05F 1/656; G05F 1/575; H02M 1/0025; H02M 3/1566
See application file for complete search history.

(56) References Cited

U.S. PATENT DOCUMENTS

| 6,466,089 | B2 | 10/2002 | Tay | |
| 6,703,813 | B1* | 3/2004 | Vladislav | G05F 1/575 |
| | | | | 323/276 |
| 7,701,284 | B2 | 4/2010 | Liao et al. | |
| 8,093,944 | B2 | 1/2012 | Liao | |
| 8,917,114 | B2 | 12/2014 | Li | |
| 2019/0302821 | A1* | 10/2019 | Maki | G05F 1/462 |
| 2022/0397926 | A1* | 12/2022 | Bonomi | G05F 1/575 |

FOREIGN PATENT DOCUMENTS

| CN | 101226207 B | 8/2010 |
| TW | I346468 B | 8/2011 |
| TW | I390840 B | 3/2013 |

* cited by examiner

*Primary Examiner* — Alex Torres-Rivera
(74) *Attorney, Agent, or Firm* — McClure, Qualey & Rodack, LLP

(57) ABSTRACT

An impedance-tracking circuit includes a voltage divider, a first dynamic resistor, and a first amplifier. The voltage divider divides a voltage difference between a first voltage and a second voltage to generate a divided voltage. The first dynamic resistor has a first resistance value and is coupled between the first voltage and a third voltage. The first dynamic resistor adjusts the first resistance value according to a first control signal. The first amplifier compares the divided voltage with the third voltage to generate the first control signal.

20 Claims, 8 Drawing Sheets

IMPEDANCE-TRACKING CIRCUIT

CROSS REFERENCE TO RELATED APPLICATIONS

This application claims the benefit of U.S. Provisional Application No. 63/293,686, filed on Dec. 24, 2021, the entirety of which is incorporated by reference herein.

This Application claims priority of Taiwan Patent Application No. 111143741, filed on Nov. 16, 2022, the entirety of which is incorporated by reference herein.

BACKGROUND OF THE INVENTION

Field of the Invention

The present invention relates in general to impedance-tracking circuits and integrated circuits, and it relates in particular to an impedance-tracking circuit for tracking the impedance ratio of a feedback circuit of a low dropout regulator.

Description of the Related Art

A traditional low-dropout regulator (LDO) is designed to connect a feed-forward capacitor in parallel between the output voltage and the feedback voltage to generate an additional zero through the feed-forward capacitor to increase the loop frequency and to improve such frequency response characteristics as phase margin (PM) and power supply rejection ratio (PSRR).

FIG. 7 is a circuit diagram of an integrated circuit of the prior art. The integrated circuit 700 includes an error amplifier EA, a power transistor MPR, a first feedback resistor RFB1, a second feedback resistor RFB2, and a feedforward capacitor CFF. The error amplifier EA compares the feedback voltage VFB and the reference voltage VREF to generate a driving signal SD. The power transistor MPR provides the supply voltage VDD to the output terminal NO according to the driving signal SD to generate an output voltage VOUT. The first feedback resistor RFB1, the second feedback resistor RFB2, and the feedforward capacitor CFF are configured to divide the output voltage VOUT to generate a feedback voltage VFB.

Although the feed-forward capacitor CFF can generate a zero at the feedback node NFB of the feedback voltage VFB to increase the bandwidth of the feedback node NFB, the output node NO of the output voltage VOUT and the feedback node NFB are different, and the difference makes the transient response speeds of the output voltage VOUT and the feedback voltage VFB different. When the low-dropout voltage regulator is soft-started, the feedback voltage VFB cannot reflect the real state of the output voltage VOUT in real time, and the error amplifier EA loses correct control on the output voltage VOUT.

Therefore, we need a circuit that can adjust the ratio of the feedback resistor in real time to improve the transient response speed of the low-dropout voltage regulator with the feedforward capacitor.

BRIEF SUMMARY OF THE INVENTION

The present invention proposes an impedance-tracking circuit for maintaining the target impedance ratio at a preset impedance ratio. In addition, the impedance-tracking circuit proposed by the present invention can be applied to a low-dropout voltage regulator to address the issue of the feedback voltage not being able to reflect the output voltage in real time when a feedforward capacitor is added, thereby improving the transient response speed of the low-dropout voltage regulator.

In an embodiment, an impedance-tracking circuit is provided, which comprises a voltage divider, a first dynamic resistor, and a first amplifier. The voltage divider divides the voltage difference between the first voltage and the second voltage to generate a divided voltage. The first dynamic resistor has a first resistance value. The first dynamic resistor is coupled between the first voltage and the third voltage. The first dynamic resistor adjusts the first resistance value according to the first control signal. The first amplifier compares the divided voltage with the third voltage to generate a first control signal.

According to an embodiment of the invention, the impedance-tracking circuit further comprises a second dynamic resistor and a second amplifier. The second dynamic resistor has a second resistance value and is coupled between the second voltage and the third voltage. The second dynamic resistor adjusts the second resistance value according to a second control signal. The second amplifier compares the divided voltage with the third voltage to generate the second control signal.

According to an embodiment of the invention, when the divided voltage is not lower than the third voltage, the first dynamic resistor decreases the first resistance value according to the first control signal, and the second dynamic resistor increases the second resistance value according to the second control signal. When the divided voltage is lower than the third voltage, the first dynamic resistor increases the first resistance value according to the first control signal, and the second dynamic resistor decreases the second resistance value according to the second control signal.

According to an embodiment of the invention, the impedance-tracking circuit further comprises a transconductance amplifier. The transconductance amplifier compares the divided voltage with a reference voltage to generate a first current and a second current. The first current is supplied to the first amplifier, and the second current is supplied to the second amplifier.

According to an embodiment of the invention, when the divided voltage is not lower than the reference voltage, the transconductance amplifier does not generate either the first current or the second current. When the divided voltage is lower than the reference voltage, the transconductance amplifier generates the first current and the second current.

According to an embodiment of the invention, the transconductance amplifier comprises a first N-type transistor, a second N-type transistor, a current source, a first P-type transistor, a second P-type transistor, a third P-type transistor, a fourth P-type transistor, a third N-type transistor, a fourth N-type transistor, a fifth N-type transistor, a sixth N-type transistor, and a seventh N-type transistor. The first N-type transistor comprises a gate terminal, a source terminal, and a drain terminal, where the gate terminal receives the divided voltage, the source terminal is coupled to a first node, and the drain terminal is coupled to a second node. The second N-type transistor comprises a gate terminal, a source terminal, and a drain terminal, where the gate terminal receives the reference voltage, the source terminal is coupled to the first node, and the drain terminal is coupled to a third node. The current source generates a bias current flowing from the first node to a ground. The first P-type transistor comprises a gate terminal, a source terminal, and a drain terminal, where the gate terminal is coupled to the second node, the source terminal receives a supply voltage, and the drain terminal is coupled to the second node. The second P-type transistor comprises a gate terminal, a source terminal, and a drain terminal, where the gate terminal is coupled to the second node, the source terminal receives the supply voltage, and the drain terminal is coupled to a fourth node. The third P-type transistor comprises a gate terminal, a source terminal, and a drain terminal, where the gate terminal is coupled to the third node, the source terminal receives the supply voltage, and the drain terminal is coupled to the third node. The fourth P-type transistor comprises a gate terminal, a source terminal, and a drain terminal, where the gate terminal is coupled to the third node, the source terminal receives the supply voltage, and the drain terminal is coupled to a fifth node. The third N-type transistor comprises a gate terminal, a source terminal, and a drain terminal, where the gate terminal is coupled to the fourth node, the source terminal is coupled to the ground, and the drain terminal is coupled to the fourth node. The fourth N-type transistor comprises a gate terminal, a source terminal, and a drain terminal, where the gate terminal is coupled to the fourth node, the source terminal is coupled to the ground, and the drain terminal is coupled to the fifth node. The fifth N-type transistor comprises a gate terminal, a source terminal, and a drain terminal, where the gate terminal is coupled to the fifth node, the source terminal is coupled to the ground, and the drain terminal is coupled to the fifth node. The sixth N-type transistor comprises a gate terminal, a source terminal, and a drain terminal, where the gate terminal is coupled to the fifth node, the source terminal is coupled to the ground, and the drain terminal generates the first current. The seventh N-type transistor comprises a gate terminal, a source terminal, and a drain terminal, where the gate terminal is coupled to the fifth node, the source terminal is coupled to the ground, and the drain terminal generates the second current.

According to another embodiment of the invention, the transconductance amplifier comprises a first P-type transistor, a second P-type transistor, a first current source, a third P-type transistor, a fourth P-type transistor, a first N-type transistor, a second N-type transistor, a third N-type transistor, a fourth N-type transistor, a fifth N-type transistor, a second current source, and a third current source. The first P-type transistor comprises a gate terminal, a source terminal, and a drain terminal, where the gate terminal receives the reference voltage, the source terminal is coupled to a first node, and the drain terminal is coupled to a second node. The second P-type transistor comprises a gate terminal, a source terminal, and a drain terminal, where the gate terminal receives the divided voltage, the source terminal is coupled to the first node, and the drain terminal is coupled to a third node. The first current source generates a first bias current flowing from a supply voltage to the first node. The third P-type transistor comprises a gate terminal, a source terminal, and a drain terminal, where the gate terminal is coupled to a fourth node, the source terminal is coupled to the supply voltage, and the drain terminal is coupled to the fourth node. The fourth P-type transistor comprises a gate terminal, a source terminal, and a drain terminal, where the gate terminal is coupled to the fourth node, the source terminal is coupled to the supply voltage, and the drain terminal is coupled to a fifth node. The first N-type transistor comprises a gate terminal, a source terminal, and a drain terminal, where the gate terminal receives a bias voltage, the source terminal is coupled to the second node, and the drain terminal is coupled to the fourth node. The second N-type transistor comprises a gate terminal, a source terminal, and a drain terminal, where the gate terminal receives the bias voltage, the source terminal is coupled to the third node, and the drain terminal is coupled to the fifth node. The third N-type transistor comprises a gate terminal, a source terminal, and a drain terminal, where the gate terminal is coupled to the fifth node, the source terminal is coupled to a ground, and the drain terminal is coupled to the fifth node. The fourth N-type transistor comprises a gate terminal, a source terminal, and a drain terminal, where the gate terminal is coupled to the fifth node, the source terminal is coupled to the ground, and the drain terminal generates the first current. The fifth N-type transistor comprises a gate terminal, a source terminal, and a drain terminal, where the gate terminal is coupled to the fifth node, the source terminal is coupled to the ground, and the drain terminal generates the second current. The second current source generates a second bias current flowing from the second node to the ground. The third current source generates a third bias current flowing from the third node to the ground, where values of the first bias current, the second bias current and the third bias current are all the same.

According to an embodiment of the invention, the first amplifier comprises a first N-type transistor, a second N-type transistor, a first P-type transistor, a second P-type transistor, a third P-type transistor, a fourth P-type transistor, a third N-type transistor, and a fourth N-type transistor. The first N-type transistor comprises a gate terminal, a source terminal, and a drain terminal, where the gate terminal receives the third voltage, the source terminal is coupled to a first node, and the drain terminal is coupled to a second node. A first current flows from the first node to a ground. The second N-type transistor comprises a gate terminal, a source terminal, and a drain terminal, where the gate terminal receives the divided voltage, the source terminal is coupled to the first node, and the drain terminal is coupled to a third node. The first P-type transistor comprises a gate terminal, a source terminal, and a drain terminal, where the gate terminal is coupled to the second node, the source terminal receives a supply voltage, and the drain terminal is coupled to the second node. The second P-type transistor comprises a gate terminal, a source terminal, and a drain terminal, where the gate terminal is coupled to the second node, the source terminal receives the supply voltage, and the drain terminal is coupled to a third node. The third P-type transistor comprises a gate terminal, a source terminal, and a drain terminal, where the gate terminal is coupled to a fourth node, the source terminal receives the supply voltage, and the drain terminal is coupled to the fourth node. The fourth P-type transistor comprises a gate terminal, a source terminal, and a drain terminal, where the gate terminal is coupled to the fourth node, the source terminal receives the supply voltage, and the drain terminal is coupled to a fifth node. The third N-type transistor comprises a gate terminal, a source terminal, and a drain terminal, where the gate terminal is coupled to the third node, the source terminal is coupled to the ground, and the drain terminal is coupled to the third node. The fourth N-type transistor comprises a gate terminal, a source terminal, and a drain terminal, where the gate terminal is coupled to the third node, the source terminal is coupled to the ground, and the drain terminal is coupled to the fifth node.

According to an embodiment of the invention, the first dynamic resistance comprises a fifth N-type transistor. The fifth N-type transistor comprises a gate terminal, a source terminal, and a drain terminal, where the gate terminal is coupled to the fifth node, the source terminal is coupled to the third voltage, and the drain terminal is coupled to the first voltage. The first control signal is generated from the fifth node.

According to an embodiment of the invention, the second amplifier comprises a first N-type transistor, a second N-type transistor, a first P-type transistor, and a second P-type transistor. The first N-type transistor comprises a gate terminal, a source terminal, and a drain terminal, where the gate terminal is coupled to a first node, the source terminal is coupled to a ground, and the drain terminal is coupled to the first node. The second N-type transistor comprises a gate terminal, a source terminal, and a drain terminal, where the gate terminal is coupled to the first node, the source terminal is coupled to the ground, and the drain terminal is coupled to a second node. The first P-type transistor comprises a gate terminal, a source terminal, and a drain terminal, where the gate terminal receives the divided voltage, the source terminal is coupled to a third node, and the drain terminal is coupled to the first node. The third node receives the second current. The second P-type transistor comprises a gate terminal, a source terminal, and a drain terminal, where the gate terminal receives the third voltage, the source terminal is coupled to the third node, and the drain terminal is coupled to the second node. The second N-type transistor acts as the second dynamic resistance, the second voltage is the voltage level of the ground, and the second node is coupled to the third voltage.

In another embodiment, an integrated circuit comprises an error amplifier, a power transistor, a first feedback resistor, a second feedback resistor, a feedforward capacitor, and an impedance tracking circuit. The error amplifier compares a feedback voltage to a reference voltage to generate a driving signal. The power transistor, according to the driving signal, provides a supply voltage to an output terminal to generate an output voltage. The first feedback resistor is coupled between the output terminal and the feedback voltage. The second feedback resistor is coupled between the feedback voltage and a ground. The feedforward capacitor is coupled between the output terminal and the feedback voltage. The impedance tracking circuit comprises a voltage divider, a dynamic resistor, and an amplifier. The voltage divider divides the output voltage to generate a divided voltage. The dynamic resistor has a resistance value and is coupled between the feedback voltage and the ground. The dynamic resistor adjusts the resistance value according to a control signal. The amplifier compares the divided voltage with the feedback voltage to generate the control signal.

According to an embodiment of the invention, the divided voltage is the output voltage multiplied by a voltage dividing ratio, and the feedback voltage is obtained by multiplying the output voltage by a feedback ratio. The voltage dividing ratio is equal to the feedback ratio.

According to an embodiment of the invention, when the divided voltage is lower than the feedback voltage, the dynamic resistance decreases the resistance value according to the control signal.

According to an embodiment of the invention, the impedance tracking circuit further comprises a transconductance amplifier. The transconductance amplifier compares the divided voltage with the reference voltage to generate a first current. The first current is supplied to the amplifier.

According to an embodiment of the invention, when the divided voltage is not lower than the reference voltage, the transconductance amplifier does not generate the first current and disables the amplifier. When the divided voltage is lower than the reference voltage, the transconductance amplifier generates the first current to enable the amplifier.

According to an embodiment of the invention, the transconductance amplifier comprises a first N-type transistor, a second N-type transistor, a current source, a first P-type transistor, a second P-type transistor, a third P-type transistor, a fourth P-type transistor, a third N-type transistor, a fourth N-type transistor, a fifth N-type transistor, and a sixth N-type transistor. The first N-type transistor comprises a gate terminal, a source terminal, and a drain terminal, where the gate terminal receives the divided voltage, the source terminal is coupled to a first node, and the drain terminal is coupled to a second node. The second N-type transistor comprises a gate terminal, a source terminal, and a drain terminal, where the gate terminal receives the reference voltage, the source terminal is coupled to the first node, and the drain terminal is coupled to a third node. The current source generates a bias current flowing from the first node to the ground. The first P-type transistor comprises a gate terminal, a source terminal, and a drain terminal, where the gate terminal is coupled to the second node, the source terminal receives the supply voltage, and the drain terminal is coupled to the second node. The second P-type transistor comprises a gate terminal, a source terminal, and a drain terminal, where the gate terminal is coupled to the second node, the source terminal receives the supply voltage, and the drain terminal is coupled to a fourth node. The third P-type transistor comprises a gate terminal, a source terminal, and a drain terminal, where the gate terminal is coupled to the third node, the source terminal receives the supply voltage, and the drain terminal is coupled to the third node. The fourth P-type transistor comprises a gate terminal, a source terminal, and a drain terminal, where the gate terminal is coupled to the third node, the source terminal receives the supply voltage, and the drain terminal is coupled to a fifth node. The third N-type transistor comprises a gate terminal, a source terminal, and a drain terminal, where the gate terminal is coupled to the fourth node, the source terminal is coupled to the ground, and the drain terminal is coupled to the fourth node. The fourth N-type transistor comprises a gate terminal, a source terminal, and a drain terminal, where the gate terminal is coupled to the fourth node, the source terminal is coupled to the ground, and the drain terminal is coupled to the fifth node. The fifth N-type transistor comprises a gate terminal, a source terminal, and a drain terminal, where the gate terminal is coupled to the fifth node, the source terminal is coupled to the ground, and the drain terminal is coupled to the fifth node. The sixth N-type transistor comprises a gate terminal, a source terminal, and a drain terminal, where the gate terminal is coupled to the fifth node, the source terminal is coupled to the ground, and the drain terminal generates the first current.

According to another embodiment of the invention, the transconductance amplifier comprises a first P-type transistor, a second P-type transistor, a third P-type transistor, a fourth P-type transistor, a first N-type transistor, a second N-type transistor, a third N-type transistor, a fourth N-type transistor, a second current source, and a third current source. The first P-type transistor comprises a gate terminal, a source terminal, and a drain terminal, where the gate terminal receives the reference voltage, the source terminal is coupled to a first node, and the drain terminal is coupled to a second node. The second P-type transistor comprises a gate terminal, a source terminal, and a drain terminal, where the gate terminal receives the divided voltage, the source terminal is coupled to the first node, and the drain terminal is coupled to a third node. The first current source generates a first bias current flowing from the supply voltage to the first node. The third P-type transistor comprises a gate terminal, a source terminal, and a drain terminal, where the gate terminal is coupled to a fourth node, the source terminal is coupled to the supply voltage, and the drain terminal is coupled to the fourth node. The fourth P-type transistor comprises a gate terminal, a source terminal, and a drain terminal, where the gate terminal is coupled to the fourth node, the source terminal is coupled to the supply voltage, and the drain terminal is coupled to a fifth node. The first N-type transistor comprises a gate terminal, a source terminal, and a drain terminal, where the gate terminal receives a bias voltage, the source terminal is coupled to the second node, and the drain terminal is coupled to the fourth node. The second N-type transistor comprises a gate terminal, a source terminal, and a drain terminal, where the gate terminal receives the bias voltage, the source terminal is coupled to the third node, and the drain terminal is coupled to the fifth node. The third N-type transistor comprises a gate terminal, a source terminal, and a drain terminal, where the gate terminal is coupled to the fifth node, the source terminal is coupled to the ground, and the drain terminal is coupled to the fifth node. The fourth N-type transistor comprises a gate terminal, a source terminal, and a drain terminal, where the gate terminal is coupled to the fifth node, the source terminal is coupled to the ground, and the drain terminal generates the first current. The second current source generates a second bias current flowing from the second node to the ground. The third current source generates a third bias current flowing from the third node to the ground. Values of the first bias current, the second bias current and the third bias current are all the same.

According to an embodiment of the invention, the amplifier comprises a first N-type transistor, a second N-type transistor, a first P-type transistor, a second P-type transistor, a third P-type transistor, a fourth P-type transistor, a third N-type transistor, and a fourth N-type transistor. The first N-type transistor comprises a gate terminal, a source terminal, and a drain terminal, where the gate terminal receives the divided voltage, the source terminal is coupled to a first node, and the drain terminal is coupled to a second node. The first current flows from the first node to a ground. The second N-type transistor comprises a gate terminal, a source terminal, and a drain terminal, where the gate terminal receives the feedback voltage, the source terminal is coupled to the first node, and the drain terminal is coupled to a third node. The first P-type transistor comprises a gate terminal, a source terminal, and a drain terminal, where the gate terminal is coupled to the second node, the source terminal receives a supply voltage, and the drain terminal is coupled to the second node. The second P-type transistor comprises a gate terminal, a source terminal, and a drain terminal, where the gate terminal is coupled to the second node, the source terminal receives the supply voltage, and the drain terminal is coupled to a fourth node. The third P-type transistor comprises a gate terminal, a source terminal, and a drain terminal, where the gate terminal is coupled to the third node, the source terminal receives the supply voltage, and the drain terminal is coupled to the third node. The fourth P-type transistor comprises a gate terminal, a source terminal, and a drain terminal, where the gate terminal is coupled to the third node, the source terminal receives the supply voltage, and the drain terminal is coupled to a fifth node. The third N-type transistor comprises a gate terminal, a source terminal, and a drain terminal, where the gate terminal is coupled to the fourth node, the source terminal is coupled to the ground, and the drain terminal is coupled to the fourth node. The fourth N-type transistor comprises a gate terminal, a source terminal, and a drain terminal, where the gate terminal is coupled to the fourth node, the source terminal is coupled to the ground, and the drain terminal is coupled to the fifth node.

According to an embodiment of the invention, the dynamic resistance comprises a fifth N-type transistor. The fifth N-type transistor comprises a gate terminal, a source terminal, and a drain terminal, where the gate terminal is coupled to the fifth node, the source terminal is coupled to the ground, and the drain terminal is coupled to the feedback voltage, wherein the first control signal is generated at the fifth node.

According to another embodiment of the invention, the amplifier comprises a first N-type transistor, a second N-type transistor, a first P-type transistor, and a second P-type transistor. The first N-type transistor comprises a gate terminal, a source terminal, and a drain terminal, where the gate terminal is coupled to a first node, the source terminal is coupled to a ground, and the drain terminal is coupled to the first node. The second N-type transistor comprises a gate terminal, a source terminal, and a drain terminal, where the gate terminal is coupled to the first node, the source terminal is coupled to the ground, and the drain terminal is coupled to a second node. The first P-type transistor comprises a gate terminal, a source terminal, and a drain terminal, where the gate terminal receives the divided voltage, the source terminal is coupled to a third node, and the drain terminal is coupled to the first node, wherein the third node receives the second current. The second P-type transistor comprises a gate terminal, a source terminal, and a drain terminal, where the gate terminal receives the feedback voltage, the source terminal is coupled to the third node, and the drain terminal is coupled to the second node. The second N-type transistor acts as the dynamic resistor, and the second node is coupled to the feedback voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
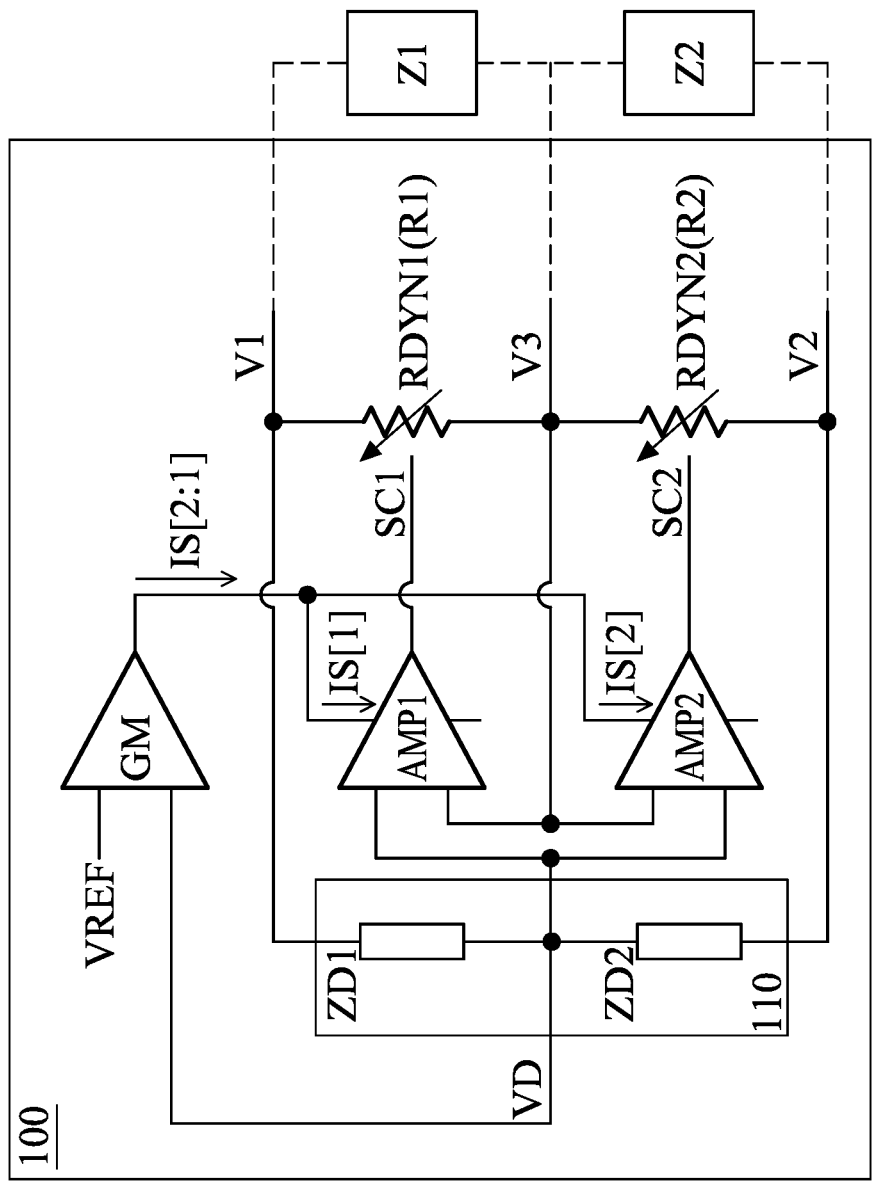
FIG. 1 is a circuit diagram of an impedance-tracking circuit in accordance with an embodiment of the present invention.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

FIG. 1 is a circuit diagram of an impedance-tracking circuit in accordance with an embodiment of the present invention. As shown in FIG. 1, the impedance-tracking circuit 100 includes a voltage divider 110, a first dynamic resistor RDYN1, a first amplifier AMP1, a second dynamic resistor RDYN2, and a second amplifier AMP2.

The voltage divider 110 includes a first voltage dividing impedance ZD1 and a second voltage dividing impedance ZD2. The first voltage dividing impedance ZD1 and the second voltage dividing impedance ZD2 are coupled between the first voltage V1 and the second voltage V2, which divide the voltage difference between the first voltage V1 and the second voltage V2 according to the impedance ratio of the first voltage dividing impedance ZD1 and the second voltage dividing impedance ZD2 to generate the divided voltage VD.

The first dynamic resistor RDYN1 has a first resistance value R1 coupled between the first voltage V1 and the third voltage V3, and the first resistance value R1 is adjusted according to the first control signal SC1. The first amplifier AMP1 compares the divided voltage VD with the third voltage V3 to generate a first control signal SC1 so as to adjust the first resistance value R1 of the first dynamic resistor RDYN1.

The second dynamic resistor RDYN2 has a second resistance value R2 coupled between the second voltage V2 and the third voltage V3, and the second resistance value R2 is adjusted according to the second control signal SC2. The second amplifier AMP2 compares the divided voltage VD with the third voltage V3 to generate a second control signal SC2 so as to adjust the second resistance value R2 of the second dynamic resistor RDYN2.

According to one embodiment of the present invention, when the divided voltage VD is not lower than the third voltage V3, the first dynamic resistor RDYN1 decreases the first resistance value R1 according to the first control signal SC1, and the second dynamic resistor RDYN2 increases the second resistance value R2 according to the second control signal SC2. According to another embodiment of the present invention, when the divided voltage VD is lower than the third voltage V3, the first dynamic resistor RDYN1 increases the first resistance value R1 according to the first control signal SC1, and the second dynamic resistor RDYN2 decreases the second resistance value R2 according to the second control signal SC2.

According to some embodiments of the present invention, when the first impedance Z1 is coupled between the first voltage V1 and the third voltage V3 and the second impedance Z2 is coupled between the third voltage V3 and the second voltage V2, the third voltages V3 obtained by the voltage difference between the first voltage V1 and the second voltage V2 divided by the first impedance Z1 and the second impedance Z2 change accordingly since the first impedance Z1 and the second impedance Z2 change with time. The impedance-tracking circuit 100 dynamically adjusts the first dynamic resistor RDYN1 and the second dynamic resistor RDYN2, so that the impedance ratio of the impedance between the first voltage V1 and the third voltage V3 and the impedance between the third voltage V3 and the second voltage V2 can track the voltage dividing ratio of the first voltage dividing impedance ZD1 and the second voltage dividing impedance ZD2 in real time, and the third voltage V3 can track the voltage variation of the divided voltage VD.

In order to simplify the description herein, FIG. 1 is illustrated with 2 amplifiers, 2 dynamic resistors, 2 voltage dividing impedances, and 2 impedances connected in series between the first voltage V1 and the second voltage V2, but not intended to be limited thereto. According to other embodiments of the present invention, N impedances may be connected in series between the first voltage V1 and the second voltage V2. The impedance-tracking circuit 100 may include N amplifiers, N dynamic resistors, and N voltage dividing impedances. The impedance-tracking circuit 100 is configured to track the ratios among the N impedances to the ratios among the N voltage-dividing impedances.

As shown in FIG. 1, the impedance-tracking circuit 100 further includes a transconductance amplifier GM. The transconductance amplifier GM compares the divided voltage VD with the reference voltage VREF to generate a first current IS[1] and a second current IS[2], where the first current IS[1] is supplied to the first amplifier AMP1, and the second current IS[2] is supplied to the second amplifier AMP2.

According to one implementation of the present invention, when the divided voltage VD is not lower than the reference voltage VREF, the transconductance amplifier GM does not generate either the first current IS[1] or the second current IS[2], and then turns off the first amplifier AMP1 and the second amplifier AMP2. According to another embodiment of the present invention, when the divided voltage VD is lower than the reference voltage VREF, the transconductance amplifier GM generates a first current IS[1] and a second current IS[2] to activate the first amplifier AMP1 and the second amplifier AMP2 so that the third voltage V3 is able to track the voltage variation of the divided voltage VD.

Figure 2:
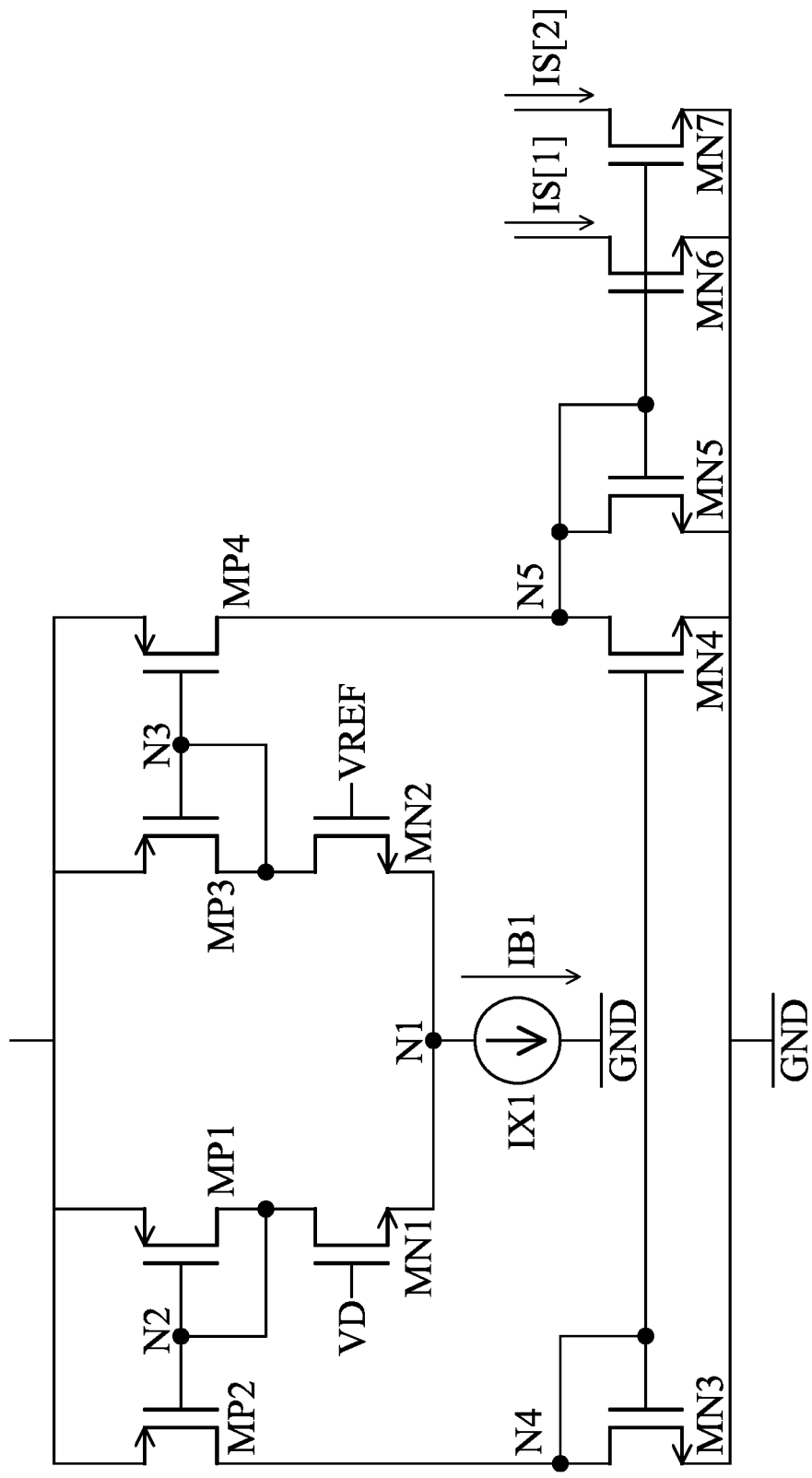
FIG. 2 is a circuit diagram of a transconductance amplifier in accordance with an embodiment of the present invention.

FIG. 2 is a circuit diagram of a transconductance amplifier in accordance with an embodiment of the present invention. According to an embodiment of the present invention, the transconductance amplifier 200 corresponds to the transconductance amplifier GM in FIG. 1. As shown in FIG. 2, the transconductance amplifier 200 includes a first N-type transistor MN1, a second N-type transistor MN2, and a first current source IX1.

The first N-type transistor MN1 includes a gate terminal, a source terminal, and a drain terminal, where the gate terminal receives the divided voltage VD, the source terminal is coupled to the first node N1, and the drain terminal is coupled to the second node N2. The second N-type transistor MN2 includes a gate terminal, a source terminal, and a drain terminal, where the gate terminal receives the reference voltage VREF, the source terminal is coupled to the first node N2, and the drain terminal is coupled to the third node N3. The first current source IX1 is configured to generate a first bias current IB1 flowing from the first node N1 to the ground GND.

As shown in FIG. 2, the transconductance amplifier 200 further includes a first P-type transistor MP1, a second P-type transistor MP2, a third P-type transistor MP3, a fourth P-type transistor MP4, a third N-type transistor MN3, and a fourth N-type transistor MN4.

The first P-type transistor MP1 includes a gate terminal, a source terminal, and a drain terminal, where the gate terminal is coupled to the second node N2, the source terminal receives the supply voltage VDD, and the drain terminal is coupled to the second node N2. The second P-type transistor MP2 includes a gate terminal, a source terminal, and a drain terminal, where the gate terminal is coupled to the second node N2, the source terminal receives the supply voltage VDD, and the drain terminal is coupled to the fourth node N4.

The third P-type transistor MP3 includes a gate terminal, a source terminal, and a drain terminal, where the gate terminal is coupled to the third node N3, the source terminal receives the supply voltage VDD, and the drain terminal is coupled to the third node N3. The fourth P-type transistor MP4 includes a gate terminal, a source terminal, and a drain terminal, where the gate terminal is coupled to the third node N3, the source terminal receives the supply voltage VDD, and the drain terminal is coupled to the fifth node N5.

The third N-type transistor MN3 includes a gate terminal, a source terminal, and a drain terminal, where the gate terminal is coupled to the fourth node N4, the source terminal is coupled to the ground GND, and the drain terminal is coupled to the fourth node N4. The fourth N-type transistor MN4 includes a gate terminal, a source terminal, and a drain terminal, where the gate terminal is coupled to the fourth node N4, the source terminal is coupled to the ground GND, and the drain terminal is coupled to the fifth node N5.

As shown in FIG. 2, the transconductance amplifier 200 further includes a fifth N-type transistor MN5, a sixth N-type transistor MN6, and a seventh N-type transistor MN7. The fifth N-type transistor MN5 includes a gate terminal, a source terminal, and a drain terminal, where the gate terminal is coupled to the fifth node N5, the source terminal is coupled to the ground GND, and the drain terminal is coupled to the fifth node N5.

The sixth N-type transistor MN6 includes a gate terminal, a source terminal, and a drain terminal, where the gate terminal is coupled to the fifth node N5, the source terminal is coupled to the ground GND, and the drain terminal generates the first current IS[1]. The seventh N-type transistor MN7 includes a gate terminal, a source terminal, and a drain terminal, where the gate terminal is coupled to the fifth node N5, the source terminal is coupled to the ground GND, and the drain terminal generates the second current IS[2]. According to the embodiment shown in FIG. 1 of the present invention, the first current IS[1] and the second current IS[2] are configured to power the first amplifier AMP1 and the second amplifier AMP2 respectively.

According to other embodiments of the present invention, the transconductance amplifier 200 may include a plurality of sixth N-type transistors MN6 and/or a plurality of seventh N-type transistors MN7 to generate more currents. The six N-type transistors MN6 and the seventh N-type transistor MN7 generating the first current IS[1] and the second current IS[2] is merely for illustration and explanation, but not intended to be limited thereto.

Figure 3:
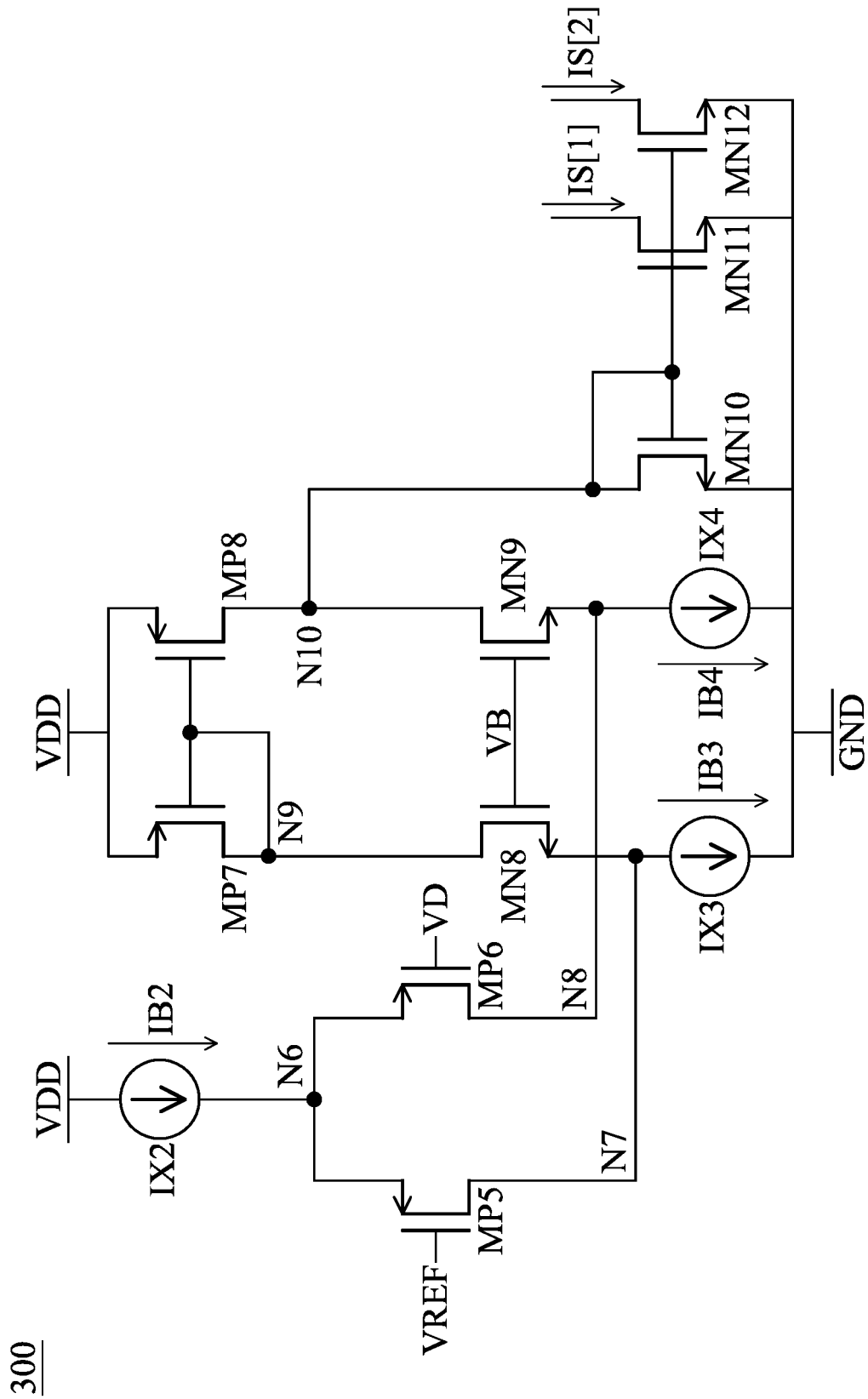
FIG. 3 is a circuit diagram of a transconductance amplifier in accordance with another embodiment of the present invention.

FIG. 3 is a circuit diagram of a transconductance amplifier in accordance with another embodiment of the present invention. According to an embodiment of the present invention, the transconductance amplifier 300 corresponds to the transconductance amplifier GM in FIG. 1. As shown in FIG. 3, the transconductance amplifier 300 includes a fifth P-type transistor MP5, a sixth P-type transistor MP6, and a second current source IX2.

The fifth P-type transistor MP5 includes a gate terminal, a source terminal, and a drain terminal, where the gate terminal receives the reference voltage VREF shown in FIG. 1, the source terminal is coupled to the sixth node N6, and the drain terminal is coupled to the seventh node N7. The sixth P-type transistor MP6 includes a gate terminal, a source terminal, and a drain terminal, where the gate terminal receives the divided voltage VD in FIG. 1, the source terminal is coupled to the sixth node N6, and the drain terminal is coupled to the eighth node N8. The second current source IX2 generates a second bias current IB2 flowing from the supply voltage VDD to the sixth node N6.

As shown in FIG. 3, the transconductance amplifier 300 further includes a seventh P-type transistor MP7, an eighth P-type transistor MP8, an eighth N-type transistor MN8, a ninth N-type transistor MN9, a third current source IX3 and a fourth current source IX4.

The seventh P-type transistor MP7 includes a gate terminal, a source terminal, and a drain terminal, where the gate terminal is coupled to the ninth node N9, the source terminal is coupled to the supply voltage VDD, and the drain terminal is coupled to the ninth node N9. The eighth P-type transistor MP8 includes a gate terminal, a source terminal, and a drain terminal, where the gate terminal is coupled to the ninth node N9, the source terminal is coupled to the supply voltage VDD, and the drain terminal is coupled to the tenth node N10.

The eighth N-type transistor MN8 includes a gate terminal, a source terminal, and a drain terminal, where the gate terminal receives the bias voltage VB, the source terminal is coupled to the seventh node N7, and the drain terminal is coupled to the ninth node N9. The ninth N-type transistor MN9 includes a gate terminal, a source terminal, and a drain terminal, where the gate terminal receives the bias voltage VB, the source terminal is coupled to the eighth node N8, and the drain terminal is coupled to the tenth node N10.

The third current source IX3 generates a third bias current IB3 flowing from the seventh node N7 to the ground GND, and the fourth current source IX4 generates a fourth bias current IB4 flowing from the eighth node N8 to the ground GND, where the values of the second bias current IB2, the third bias current IB3, and the fourth bias current IB4 are all the same.

As shown in FIG. 3, the transconductance amplifier 300 further includes a tenth N-type transistor MN10, an eleventh N-type transistor MN11, and a twelfth N-type transistor MN12. The tenth N-type transistor MN10 includes a gate terminal, a source terminal, and a drain terminal, where the gate terminal is coupled to the tenth node N10, the source terminal is coupled to the ground GND, and the drain terminal is coupled to the tenth node N10. The eleventh N-type transistor MN11 includes a gate terminal, a source terminal, and a drain terminal, where the gate terminal is coupled to the tenth node N10, the source terminal is coupled to the ground GND, and the drain terminal generates the first current IS[1].

The twelfth N-type transistor MN12 includes a gate terminal, a source terminal, and a drain terminal, where the gate terminal is coupled to the tenth node N10, the source terminal is coupled to the ground GND, and the drain terminal generates a second current IS[2]. According to the embodiment shown in FIG. 1 of the present invention, the first current IS[1] and the second current IS[2] are configured to supply power to the first amplifier AMP1 and the second amplifier AMP2 respectively.

Figure 4:
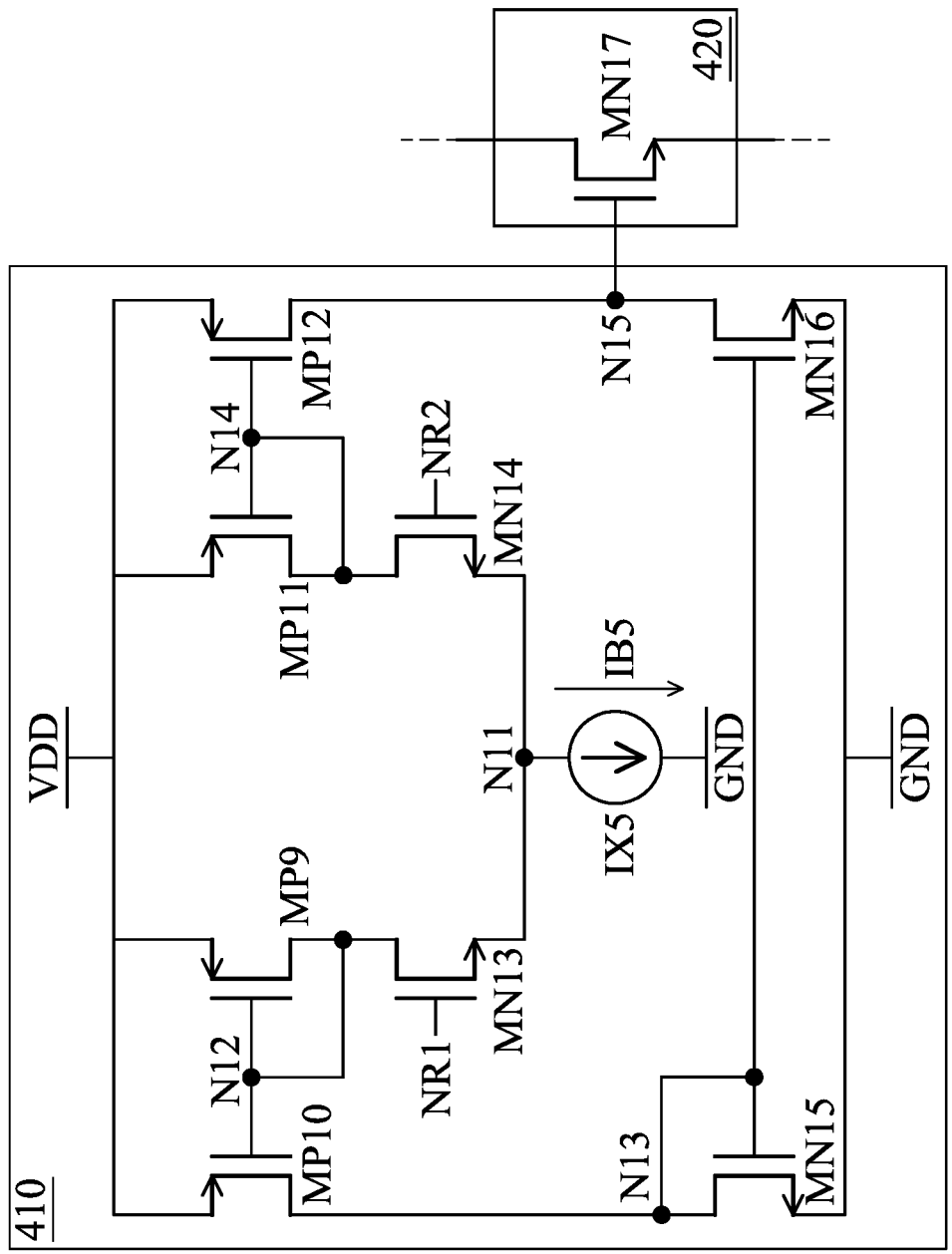
FIG. 4 is a circuit diagram of an amplifier and a dynamic resistor in accordance with an embodiment of the present invention.

FIG. 4 is a circuit diagram of an amplifier and a dynamic resistor in accordance with an embodiment of the present invention. As shown in FIG. 4, the amplifier 410 includes a thirteenth N-type transistor MN13, a fourteenth N-type transistor MN14, and a fifth current source IX5.

The thirteenth N-type transistor MN13 includes a gate terminal, a source terminal, and a drain terminal, where the gate terminal is coupled to the first receiving node NR1, the source terminal is coupled to the eleventh node N11, and the drain terminal is coupled to the twelfth node N12. The fourteenth N-type transistor MN14 includes a gate terminal, a source terminal, and a drain terminal, where the gate terminal is coupled to the second receiving node NR2, the source terminal is coupled to the eleventh node N11, and the drain terminal is coupled to the thirteenth node N13. The fifth current source IX5 is configured to generate a fifth bias current IB5, where the fifth bias current IB5 flows from the eleventh node N11 to the ground GND.

As shown in FIG. 4, the amplifier 410 further includes a ninth P-type transistor MP9, a tenth P-type transistor MP10, an eleventh P-type transistor MP11, a twelfth P-type transistor MP12, a fifteenth N-type transistors MN15, and a sixteenth N-type transistor MN16.

The ninth P-type transistor MP9 includes a gate terminal, a source terminal, and a drain terminal, where the gate terminal is coupled to the twelfth node N12, the source terminal receives the supply voltage VDD, and the drain terminal is coupled to the twelfth node N12. The tenth P-type transistor MP10 includes a gate terminal, a source terminal, and a drain terminal, where the gate terminal is coupled to the twelfth node N12, the source terminal receives the supply voltage VDD, and the drain terminal is coupled to the thirteenth node N13.

The eleventh P-type transistor MP11 includes a gate terminal, a source terminal, and a drain terminal, where the gate terminal is coupled to the fourteenth node N14, the source terminal receives the supply voltage VDD, and the drain terminal is coupled to the fourteenth node N14. The twelfth P-type transistor includes a gate terminal, a source terminal, and a drain terminal, where the gate terminal is coupled to the fourteenth node N14, the source terminal receives the supply voltage VDD, and the drain terminal is coupled to the fifteenth node N15.

The fifteenth N-type transistor MN15 includes a gate terminal, a source terminal, and a drain terminal, where the gate terminal is coupled to the thirteenth node N13, the source terminal is coupled to the ground GND, and the drain terminal is coupled to the thirteenth node N13. The sixteenth N-type transistor MN16 includes a gate terminal, a source terminal, and a drain terminal, where the gate terminal is coupled to the thirteenth node N13, the source terminal is coupled to the ground GND, and the drain terminal is coupled to the fifteenth node N15.

The dynamic resistor 420 includes a seventeenth N-type transistor MN17, where the gate terminal of the seventeenth N-type transistor MN17 is coupled to the fifteenth node N15. According to an embodiment of the present invention, the amplifier 410 corresponds to the first amplifier AMP1 in FIG. 1, and the dynamic resistor 420 corresponds to the first dynamic resistor RDYN1 in FIG. 1. The fifth bias current IB5 in FIG. 4 is provided by the first current IS[1], the first input node NR1 receives the third voltage V3 in FIG. 1, and the second input node NR2 receives the divided voltage VD in FIG. 1, the seventeenth N-type transistor MN17 is coupled between the first voltage V1 and the third voltage V3.

According to another embodiment of the present invention, the amplifier 410 corresponds to the second amplifier AMP2 in FIG. 1, and the dynamic resistor 420 corresponds to the second dynamic resistor RDYN2 in FIG. 1. The fifth bias current IB5 in FIG. 4 is provided by the second current IS[2], the first input node NR1 receives the divided voltage VD in FIG. 1, the second input node NR2 receives the third voltage in FIG. 1 V3, and the seventeenth N-type transistor MN17 is coupled between the third voltage V3 and the second voltage V2.

Figure 5:
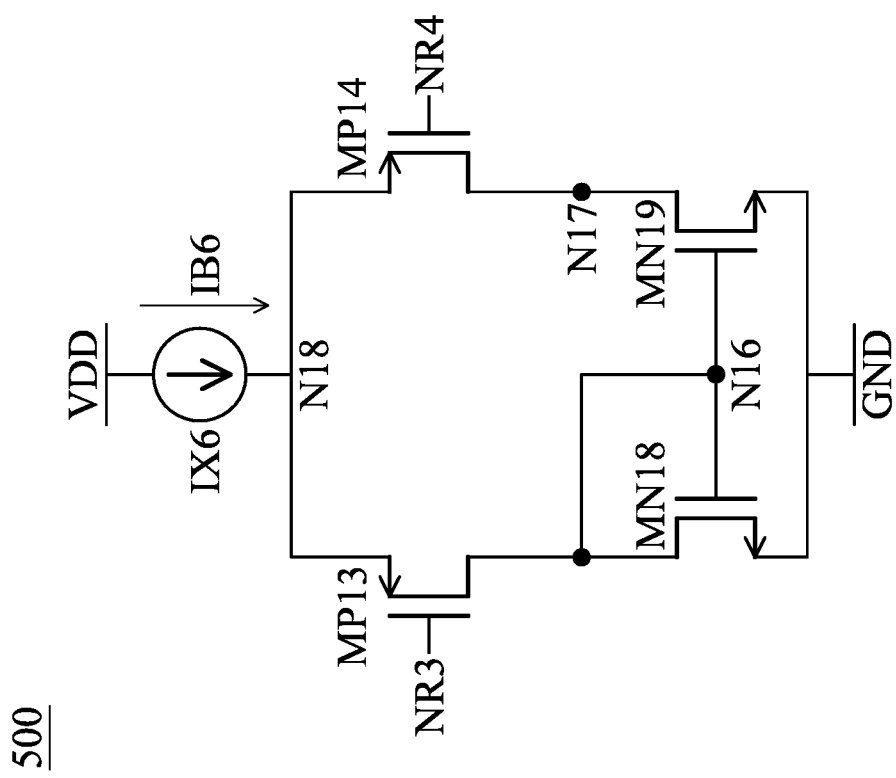
FIG. 5 is a circuit diagram of the amplifier in accordance with another embodiment of the present invention.

FIG. 5 is a circuit diagram of the amplifier in accordance with another embodiment of the present invention. As shown in FIG. 5, the amplifier 500 includes an eighteenth N-type transistor MN18, a nineteenth N-type transistor MN19, a thirteenth P-type transistor MP13, a fourteenth P-type transistor MP14, and a sixth current source IX6.

The eighteenth N-type transistor MN18 includes a gate terminal, a source terminal, and a drain terminal, where the gate terminal is coupled to the sixteenth node N16, the source terminal is coupled to the ground GND, and the drain terminal is coupled to the sixteenth node N16. The nineteenth N-type transistor MN19 includes a gate terminal, a source terminal, and a drain terminal, where the gate terminal is coupled to the sixteenth node N16, the source terminal is coupled to the ground GND, and the drain terminal is coupled to the seventeenth node N17.

The thirteenth P-type transistor MP13 includes a gate terminal, a source terminal, and a drain terminal, wherein the gate terminal receives the third receiving node NR3, the source terminal is coupled to the eighteenth node N18, and the drain terminal is coupled to the sixteenth node N18 Node N15. The fourteenth P-type transistor MP14 includes a gate terminal, a source terminal, and a drain terminal, where the gate terminal receives the fourth receiving node NR4, the source terminal is coupled to the eighteenth node N18, and the drain terminal is coupled to the seventeenth node N17. The sixth current source IX6 is configured to generate a sixth bias current IB6, where the sixth bias current IB6 flows from the supply voltage VDD to the eighteenth node N18.

According to an embodiment of the present invention, the amplifier 500 corresponds to the second amplifier AMP2 in FIG. 1. According to an embodiment of the present invention, the second voltage V2 in FIG. 1 is the voltage level of the ground GND, the nineteenth N-type transistor MN19 acts as the second dynamic resistor RDYN2 in FIG. 1, and the nineteenth N-type transistor MN19 is coupled between the third voltage V3 and the second voltage V2 in FIG. 1. In other words, the seventeenth node N17 is coupled to the third voltage V3. In addition, the third receiving node NR3 receives the divided voltage VD, the fourth receiving node NR4 receives the third voltage V3, and the sixth bias current IB6 is provided by the second current IS[2] in FIG. 1.

Figure 6:
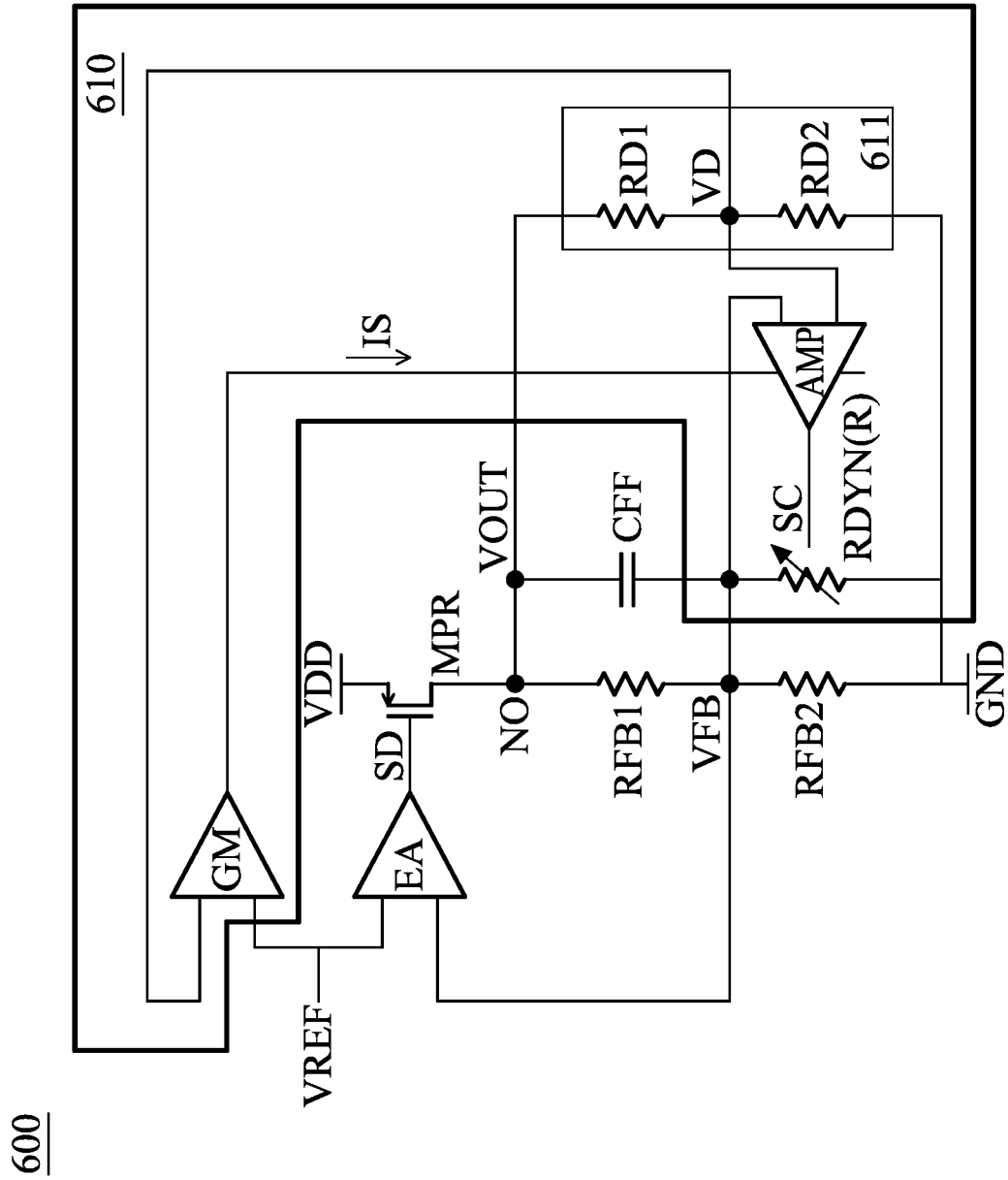
FIG. 6 is a circuit diagram showing an integrated circuit in accordance with an embodiment of the present invention.

FIG. 6 is a circuit diagram showing an integrated circuit in accordance with an embodiment of the present invention. As shown in FIG. 6, the integrated circuit 600 includes an error amplifier EA, a power transistor MPR, a first feedback resistor RFB1, a second feedback resistor RFB2, and a feedforward capacitor CFF.

The error amplifier EA compares the feedback voltage VFB and the reference voltage VREF to generate the driving signal SD. The power transistor MPR provides the supply voltage VDD to the output terminal NO according to the driving signal SD to generate the output voltage VOUT. The first feedback resistor RFB1 is coupled between the output terminal NO and the feedback voltage VFB, and the second feedback resistor RFB2 is coupled between the feedback voltage VFB and the ground GND. The feedforward capacitor CFF is coupled between the output terminal NO and the feedback voltage VFB.

According to one embodiment of the present invention, the error amplifier EA, the power transistor MPR, the first feedback resistor RFB1, the second feedback resistor RFB2, and the feedforward capacitor CFF form a low-dropout regulator with a feedforward capacitor.

As shown in FIG. 6, the integrated circuit 600 further includes an impedance-tracking circuit 610, where the impedance-tracking circuit 610 includes a voltage divider 611, a dynamic resistor RDYN, an amplifier AMP, and a transconductance amplifier GM.

The voltage divider 611 divides the output voltage VOUT to generate a divided voltage VD. As shown in FIG. 6, the voltage divider 611 includes a first dividing resistor RD1 and a second dividing resistor RD2, the first dividing resistor RD1 is coupled between the output voltage VOUT and the divider voltage VD, and the second dividing resistor RD2 is coupled between the divided voltage VD and the ground GND.

According to one embodiment of the present invention, the divided voltage VD is the output voltage VOUT multiplied by the voltage dividing ratio of the first dividing resistor RD1 and the second dividing resistor RD2, and the feedback voltage VFB is the output voltage VOUT multiplied by the feedback ratio of the first feedback resistor RFB1 and the second feedback resistor RFB2, where the voltage dividing ratio is the same as the feedback ratio. According to an embodiment of the present invention, the first voltage dividing resistor RD1 is the first feedback resistor RFB1 multiplied by the first number, and the second voltage dividing resistor RD2 is the second feedback resistor RFB2 multiplied by the second number, where the first The first number is equal to the second number. According to some embodiments of the present invention, the first voltage dividing resistor RD1 and the second voltage dividing resistor RD2 respectively exceed the first feedback resistor RFB1 and the second feedback resistor RFB2.

The dynamic resistance RDYN is coupled between the feedback voltage VFB and the ground GND, which has a resistance value R. The amplifier AMP compares the divided voltage VD with the feedback voltage VFB to generate a control signal SC, thereby adjusting the resistance value R of the dynamic resistance RDYN. According to an embodiment of the present invention, when the divided voltage VD is lower than the feedback voltage VFB, the dynamic resistor RDYN decreases the resistance value R according to the control signal SC, so that the impedance ratio of impedance between the output voltage VOUT and the feedback voltage VFB and impedance between the feedback voltage VFB and the ground GND is equal to the voltage dividing ratio of the voltage divider 611. In other words, the impedance-tracking circuit 610 makes the feedback voltage VFB close to the divided voltage VD, so that the feedback voltage VFB is able to reflect the state of the output voltage VOUT in real time.

The transconductance amplifier GM is configured to compare the divided voltage VD with the reference voltage VREF to generate the enable current IS to supply power to the amplifier AMP. According to an embodiment of the present invention, when the divided voltage VD is not lower than the reference voltage VREF, the transconductance amplifier GM does not generate the enable current IS and disables the amplifier AMP, thereby achieving the effect of power saving. According to another embodiment of the present invention, when the divided voltage VD is lower than the reference voltage VREF, the transconductance amplifier GM generates an enable current IS to enable the amplifier AMP, thereby making the feedback voltage VFB close to the divided voltage VD through the dynamic resistor RDYN.

According to an embodiment of the present invention, the transconductance amplifier GM in FIG. 6 can be implemented by the transconductance amplifier 200 in FIG. 2, where the sixth N-type transistor MN6 or the seventh N-type transistor MN7 generates the enable current IS. According to another embodiment of the present invention, the transconductance amplifier GM in FIG. 6 can be implemented by the transconductance amplifier 300 in FIG. 3, where the eleventh N-type transistor MN11 or the twelfth N-type transistor in FIG. 3 MN12 is configured to generate the enable current IS.

According to an embodiment of the present invention, the amplifier AMP can be implemented by the amplifier 410 in FIG. 4, and the dynamic resistor RDYN can be implemented by the dynamic resistor 420. In addition, the first receiving node NR1 in FIG. 4 receives the divided voltage VD, the second receiving node NR2 receives the feedback voltage VFB, and the seventeenth transistor MN17 is coupled between the feedback voltage VFB and the ground GND.

According to another embodiment of the present invention, the amplifier AMP can be implemented by the amplifier 500 in FIG. 5, and the nineteenth N-type transistor MN19 in FIG. 5 is configured as the dynamic resistor RDYN in FIG. 6. In addition, the third receiving node NR3 receives the divided voltage VD, the fourth receiving node NR4 receives the feedback voltage VFB, and the seventeenth node N17 is coupled to the feedback voltage VFB.

Figure 7:
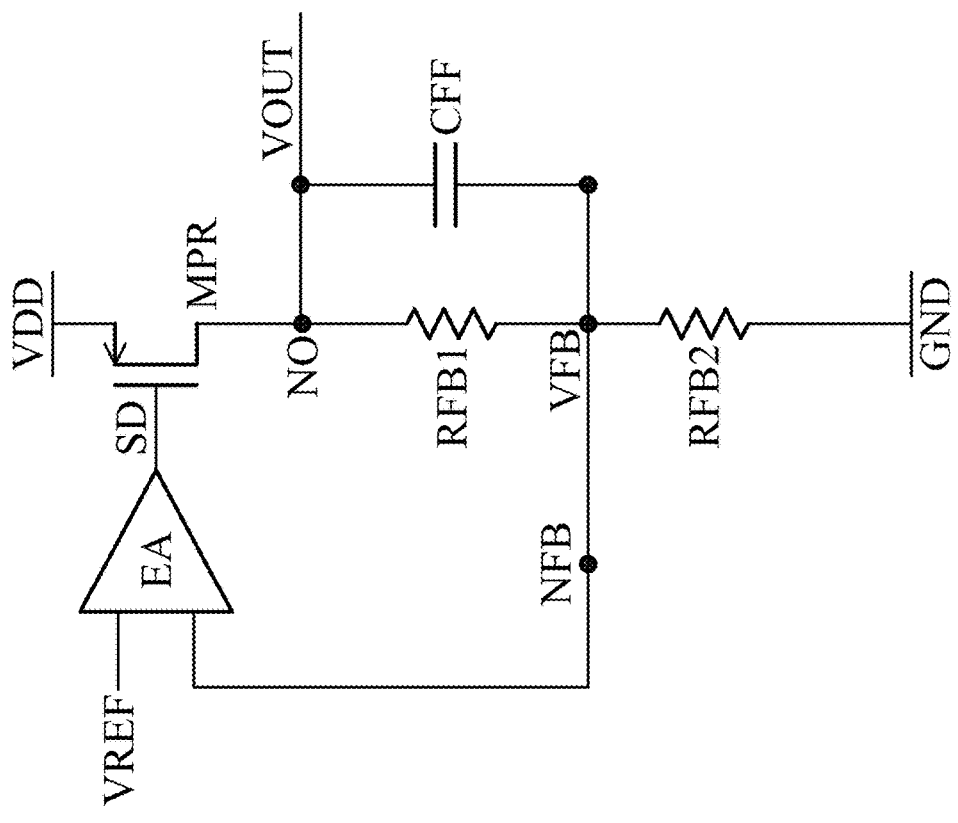
FIG. 7 is a circuit diagram of an integrated circuit of prior art.
Figure 8:
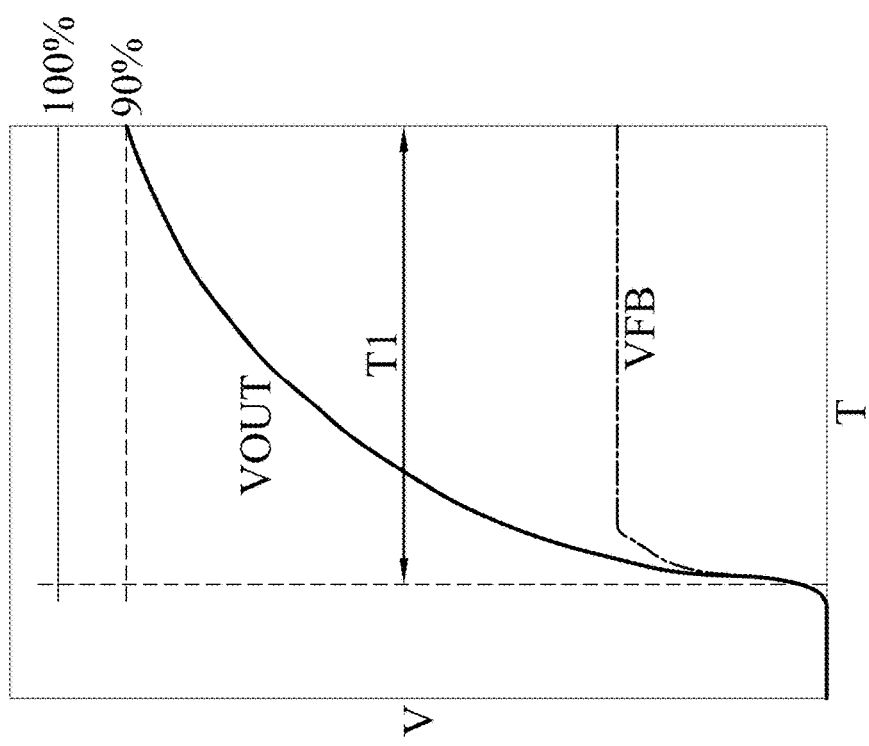
FIG. 8 is a waveform diagram of the integrated circuit in accordance with FIG. 7.

FIG. 8 is a waveform diagram of the integrated circuit in accordance with FIG. 7. As shown in FIG. 8, the waveform diagram 800 shows the variation of the feedback voltage VFB and the output voltage VOUT of the integrated circuit 700 with respect to time T, where the vertical axis is the voltage V. The feedback voltage VFB of the integrated circuit 700 reaches a stable state soon after startup, but the output voltage VOUT takes the first period T1 to reach 90% of the target voltage.

Figure 9:
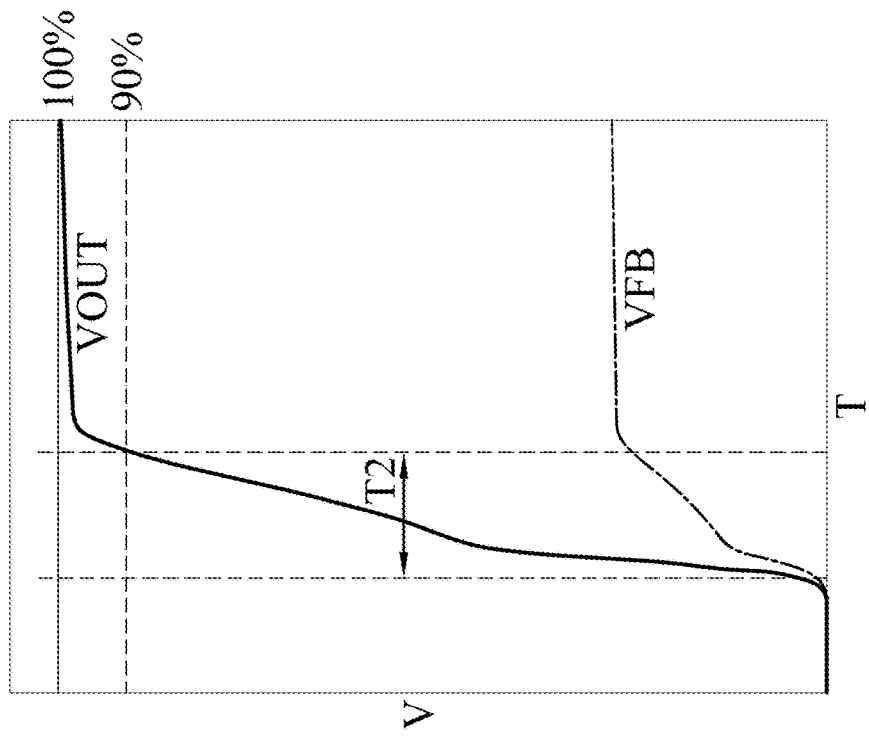
FIG. 9 is a waveform diagram of the integrated circuit of FIG. 6 in accordance with an embodiment of the present invention.

FIG. 9 is a waveform diagram of the integrated circuit of FIG. 6 in accordance with an embodiment of the present invention. As shown in FIG. 9, the waveform diagram 900 shows the variation of the feedback voltage VFB and the output voltage VOUT of the integrated circuit 600 with respect to time T, where the vertical axis is the voltage V. It takes the second period T2 for the output voltage VOUT and the feedback voltage VFB of the integrated circuit 600 to reach 90% of the target voltage, and the feedback voltage VFB is able to reflect the waveform of the output voltage VOUT in real time, where the first time T1 exceeds the second time T2.

According to some embodiments of the present invention, the first period T1 is 800 microseconds, and the second period T2 is 220 microseconds. In other words, as shown in the waveform diagram 800 and the waveform diagram 900, the impedance-tracking circuit 610 helps maintain the voltage dividing ratio between the output voltage VOUT and the feedback voltage VFB, and improves the transient response speed of the integrated circuit.

The present invention herein proposes an impedance-tracking circuit for maintaining the target impedance ratio at a preset impedance ratio. In addition, the impedance-tracking circuit proposed by the present invention can be applied to a low-dropout voltage regulator to address the issue of the feedback voltage not being able to reflect the output voltage in real time when a feedforward capacitor is added, thereby improving the transient response speed of the low-dropout voltage regulator.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An impedance-tracking circuit, comprising:
a voltage divider, dividing a voltage difference between a first voltage and a second voltage to generate a divided voltage;
a first dynamic resistor, having a first resistance value and coupled between the first voltage and a third voltage, wherein the first dynamic resistor adjusts the first resistance value according to a first control signal, so that the third voltage tracks the divided voltage; and
a first amplifier, comparing the divided voltage with the third voltage to generate the first control signal.

2. The impedance-tracking circuit as defined in claim 1, further comprising:
a second dynamic resistor, having a second resistance value and coupled between the second voltage and the third voltage, wherein the second dynamic resistor adjusts the second resistance value according to a second control signal; and
a second amplifier, comparing the divided voltage with the third voltage to generate the second control signal.

3. The impedance-tracking circuit as defined in claim 2, wherein when the divided voltage is not lower than the third voltage, the first dynamic resistor decreases the first resistance value according to the first control signal, and the second dynamic resistor increases the second resistance value according to the second control signal, wherein when the divided voltage is lower than the third voltage, the first dynamic resistor increases the first resistance value according to the first control signal, and the second dynamic resistor decreases the second resistance value according to the second control signal.

4. The impedance-tracking circuit as defined in claim 2, further comprising:
a transconductance amplifier, comparing the divided voltage with a reference voltage to generate a first current and a second current, wherein the first current is supplied to the first amplifier, and the second current is supplied to the second amplifier.

5. The impedance-tracking circuit as defined in claim 4, wherein when the divided voltage is not lower than the reference voltage, the transconductance amplifier does not generate either the first current or the second current, wherein when the divided voltage is lower than the reference voltage, the transconductance amplifier generates the first current and the second current.

6. The impedance-tracking circuit as defined in claim 4, wherein the transconductance amplifier comprises:
a first N-type transistor, comprising a gate terminal, a source terminal, and a drain terminal, wherein the gate terminal receives the divided voltage, the source terminal is coupled to a first node, and the drain terminal is coupled to a second node;
a second N-type transistor, comprising a gate terminal, a source terminal, and a drain terminal, wherein the gate terminal receives the reference voltage, the source terminal is coupled to the first node, and the drain terminal is coupled to a third node;
a current source, generating a bias current flowing from the first node to a ground;
a first P-type transistor, comprising a gate terminal, a source terminal, and a drain terminal, wherein the gate terminal is coupled to the second node, the source terminal receives a supply voltage, and the drain terminal is coupled to the second node;
a second P-type transistor, comprising a gate terminal, a source terminal, and a drain terminal, wherein the gate terminal is coupled to the second node, the source terminal receives the supply voltage, and the drain terminal is coupled to a fourth node;

a third P-type transistor, comprising a gate terminal, a source terminal, and a drain terminal, wherein the gate terminal is coupled to the third node, the source terminal receives the supply voltage, and the drain terminal is coupled to the third node;

a fourth P-type transistor, comprising a gate terminal, a source terminal, and a drain terminal, wherein the gate terminal is coupled to the third node, the source terminal receives the supply voltage, and the drain terminal is coupled to a fifth node;

a third N-type transistor, comprising a gate terminal, a source terminal, and a drain terminal, wherein the gate terminal is coupled to the fourth node, the source terminal is coupled to the ground, and the drain terminal is coupled to the fourth node;

a fourth N-type transistor, comprising a gate terminal, a source terminal, and a drain terminal, wherein the gate terminal is coupled to the fourth node, the source terminal is coupled to the ground, and the drain terminal is coupled to the fifth node;

a fifth N-type transistor, comprising a gate terminal, a source terminal, and a drain terminal, wherein the gate terminal is coupled to the fifth node, the source terminal is coupled to the ground, and the drain terminal is coupled to the fifth node;

a sixth N-type transistor, comprising a gate terminal, a source terminal, and a drain terminal, wherein the gate terminal is coupled to the fifth node, the source terminal is coupled to the ground, and the drain terminal generates the first current; and a seventh N-type transistor, comprising a gate terminal, a source terminal, and a drain terminal, wherein the gate terminal is coupled to the fifth node, the source terminal is coupled to the ground, and the drain terminal generates the second current.

7. The impedance-tracking circuit as defined in claim 4, wherein the transconductance amplifier comprises:

a first P-type transistor, comprising a gate terminal, a source terminal, and a drain terminal, wherein the gate terminal receives the reference voltage, the source terminal is coupled to a first node, and the drain terminal is coupled to a second node;

a second P-type transistor, comprising a gate terminal, a source terminal, and a drain terminal, wherein the gate terminal receives the divided voltage, the source terminal is coupled to the first node, and the drain terminal is coupled to a third node;

a first current source, generating a first bias current flowing from a supply voltage to the first node;

a third P-type transistor, comprising a gate terminal, a source terminal, and a drain terminal, wherein the gate terminal is coupled to a fourth node, the source terminal is coupled to the supply voltage, and the drain terminal is coupled to the fourth node;

a fourth P-type transistor, comprising a gate terminal, a source terminal, and a drain terminal, wherein the gate terminal is coupled to the fourth node, the source terminal is coupled to the supply voltage, and the drain terminal is coupled to a fifth node;

a first N-type transistor, comprising a gate terminal, a source terminal, and a drain terminal, wherein the gate terminal receives a bias voltage, the source terminal is coupled to the second node, and the drain terminal is coupled to the fourth node;

a second N-type transistor, comprising a gate terminal, a source terminal, and a drain terminal, wherein the gate terminal receives the bias voltage, the source terminal is coupled to the third node, and the drain terminal is coupled to the fifth node;

a third N-type transistor, comprising a gate terminal, a source terminal, and a drain terminal, wherein the gate terminal is coupled to the fifth node, the source terminal is coupled to a ground, and the drain terminal is coupled to the fifth node;

a fourth N-type transistor, comprising a gate terminal, a source terminal, and a drain terminal, wherein the gate terminal is coupled to the fifth node, the source terminal is coupled to the ground, and the drain terminal generates the first current;

a fifth N-type transistor, comprising a gate terminal, a source terminal, and a drain terminal, wherein the gate terminal is coupled to the fifth node, the source terminal is coupled to the ground, and the drain terminal generates the second current;

a second current source, generating a second bias current flowing from the second node to the ground; and a third current source, generating a third bias current flowing from the third node to the ground, wherein values of the first bias current, the second bias current and the third bias current are all the same.

8. The impedance-tracking circuit as defined in claim 2, wherein the first amplifier comprises:

a first N-type transistor, comprising a gate terminal, a source terminal, and a drain terminal, wherein the gate terminal receives the third voltage, the source terminal is coupled to a first node, and the drain terminal is coupled to a second node, wherein a first current flows from the first node to a ground;

a second N-type transistor, comprising a gate terminal, a source terminal, and a drain terminal, wherein the gate terminal receives the divided voltage, the source terminal is coupled to the first node, and the drain terminal is coupled to a third node;

a first P-type transistor, comprising a gate terminal, a source terminal, and a drain terminal, wherein the gate terminal is coupled to the second node, the source terminal receives a supply voltage, and the drain terminal is coupled to the second node;

a second P-type transistor, comprising a gate terminal, a source terminal, and a drain terminal, wherein the gate terminal is coupled to the second node, the source terminal receives the supply voltage, and the drain terminal is coupled to a third node;

a third P-type transistor, comprising a gate terminal, a source terminal, and a drain terminal, wherein the gate terminal is coupled to a fourth node, the source terminal receives the supply voltage, and the drain terminal is coupled to the fourth node;

a fourth P-type transistor, comprising a gate terminal, a source terminal, and a drain terminal, wherein the gate terminal is coupled to the fourth node, the source terminal receives the supply voltage, and the drain terminal is coupled to a fifth node;

a third N-type transistor, comprising a gate terminal, a source terminal, and a drain terminal, wherein the gate terminal is coupled to the third node, the source terminal is coupled to the ground, and the drain terminal is coupled to the third node; and a fourth N-type transistor, comprising a gate terminal, a source terminal, and a drain terminal, wherein the gate terminal is coupled to the third node, the source terminal is coupled to the ground, and the drain terminal is coupled to the fifth node.

9. The impedance-tracking circuit as defined in claim 8, wherein the first dynamic resistance comprises:
   a fifth N-type transistor, comprising a gate terminal, a source terminal, and a drain terminal, wherein the gate terminal is coupled to the fifth node, the source terminal is coupled to the third voltage, and the drain terminal is coupled to the first voltage, wherein the first control signal is generated from the fifth node.

10. The impedance-tracking circuit as defined in claim 2, wherein the second amplifier comprises:
    a first N-type transistor, comprising a gate terminal, a source terminal, and a drain terminal, wherein the gate terminal is coupled to a first node, the source terminal is coupled to a ground, and the drain terminal is coupled to the first node;
    a second N-type transistor, comprising a gate terminal, a source terminal, and a drain terminal, wherein the gate terminal is coupled to the first node, the source terminal is coupled to the ground, and the drain terminal is coupled to a second node;
    a first P-type transistor, comprising a gate terminal, a source terminal, and a drain terminal, wherein the gate terminal receives the divided voltage, the source terminal is coupled to a third node, and the drain terminal is coupled to the first node, wherein the third node receives the second current; and
    a second P-type transistor, comprising a gate terminal, a source terminal, and a drain terminal, wherein the gate terminal receives the third voltage, the source terminal is coupled to the third node, and the drain terminal is coupled to the second node;
    wherein the second N-type transistor acts as the second dynamic resistance, the second voltage is the voltage level of the ground, and the second node is coupled to the third voltage.

11. An integrated circuit, comprising:
    an error amplifier, comparing a feedback voltage to a reference voltage to generate a driving signal;
    a power transistor, according to the driving signal, provides a supply voltage to an output terminal to generate an output voltage;
    a first feedback resistor, coupled between the output terminal and the feedback voltage;
    a second feedback resistor, coupled between the feedback voltage and a ground;
    a feedforward capacitor, coupled between the output terminal and the feedback voltage; and
    an impedance tracking circuit, comprising:
    a voltage divider, dividing the output voltage to generate a divided voltage;
    a dynamic resistor, having a resistance value and coupled between the feedback voltage and the ground, wherein the dynamic resistor adjusts the resistance value according to a control signal; and
    an amplifier, comparing the divided voltage with the feedback voltage to generate the control signal.

12. The integrated circuit as defined in claim 11, wherein the divided voltage is the output voltage multiplied by a voltage dividing ratio, and the feedback voltage is obtained by multiplying the output voltage by a feedback ratio, wherein the voltage dividing ratio is equal to the feedback ratio.

13. The integrated circuit as defined in claim 11, wherein when the divided voltage is lower than the feedback voltage, the dynamic resistance decreases the resistance value according to the control signal.

14. The integrated circuit as defined in claim 11, wherein the impedance tracking circuit further comprises:
    a transconductance amplifier, comparing the divided voltage with the reference voltage to generate a first current, wherein the first current is supplied to the amplifier.

15. The integrated circuit as defined in claim 14, wherein when the divided voltage is not lower than the reference voltage, the transconductance amplifier does not generate the first current and disables the amplifier, wherein when the divided voltage is lower than the reference voltage, the transconductance amplifier generates the first current to enable the amplifier.

16. The integrated circuit as defined in claim 14, wherein the transconductance amplifier comprises:
    a first N-type transistor, comprising a gate terminal, a source terminal, and a drain terminal, wherein the gate terminal receives the divided voltage, the source terminal is coupled to a first node, and the drain terminal is coupled to a second node;
    a second N-type transistor, comprising a gate terminal, a source terminal, and a drain terminal, wherein the gate terminal receives the reference voltage, the source terminal is coupled to the first node, and the drain terminal is coupled to a third node;
    a current source, generating a bias current flowing from the first node to the ground;
    a first P-type transistor, comprising a gate terminal, a source terminal, and a drain terminal, wherein the gate terminal is coupled to the second node, the source terminal receives the supply voltage, and the drain terminal is coupled to the second node;
    a second P-type transistor, comprising a gate terminal, a source terminal, and a drain terminal, wherein the gate terminal is coupled to the second node, the source terminal receives the supply voltage, and the drain terminal is coupled to a fourth node;
    a third P-type transistor, comprising a gate terminal, a source terminal, and a drain terminal, wherein the gate terminal is coupled to the third node, the source terminal receives the supply voltage, and the drain terminal is coupled to the third node;
    a fourth P-type transistor, comprising a gate terminal, a source terminal, and a drain terminal, wherein the gate terminal is coupled to the third node, the source terminal receives the supply voltage, and the drain terminal is coupled to a fifth node;
    a third N-type transistor, comprising a gate terminal, a source terminal, and a drain terminal, wherein the gate terminal is coupled to the fourth node, the source terminal is coupled to the ground, and the drain terminal is coupled to the fourth node;
    a fourth N-type transistor, comprising a gate terminal, a source terminal, and a drain terminal, wherein the gate terminal is coupled to the fourth node, the source terminal is coupled to the ground, and the drain terminal is coupled to the fifth node;
    a fifth N-type transistor, comprising a gate terminal, a source terminal, and a drain terminal, wherein the gate terminal is coupled to the fifth node, the source terminal is coupled to the ground, and the drain terminal is coupled to the fifth node; and
    a sixth N-type transistor, comprising a gate terminal, a source terminal, and a drain terminal, wherein the gate terminal is coupled to the fifth node, the source terminal is coupled to the ground, and the drain terminal generates the first current.

17. The integrated circuit as defined in claim 14, wherein the transconductance amplifier comprises:
    a first P-type transistor, comprising a gate terminal, a source terminal, and a drain terminal, wherein the gate terminal receives the reference voltage, the source terminal is coupled to a first node, and the drain terminal is coupled to a second node;
    a second P-type transistor, comprising a gate terminal, a source terminal, and a drain terminal, wherein the gate terminal receives the divided voltage, the source terminal is coupled to the first node, and the drain terminal is coupled to a third node;
    a first current source, generating a first bias current flowing from the supply voltage to the first node;
    a third P-type transistor, comprising a gate terminal, a source terminal, and a drain terminal, wherein the gate terminal is coupled to a fourth node, the source terminal is coupled to the supply voltage, and the drain terminal is coupled to the fourth node;
    a fourth P-type transistor, comprising a gate terminal, a source terminal, and a drain terminal, wherein the gate terminal is coupled to the fourth node, the source terminal is coupled to the supply voltage, and the drain terminal is coupled to a fifth node;
    a first N-type transistor, comprising a gate terminal, a source terminal, and a drain terminal, wherein the gate terminal receives a bias voltage, the source terminal is coupled to the second node, and the drain terminal is coupled to the fourth node;
    a second N-type transistor, comprising a gate terminal, a source terminal, and a drain terminal, wherein the gate terminal receives the bias voltage, the source terminal is coupled to the third node, and the drain terminal is coupled to the fifth node;
    a third N-type transistor, comprising a gate terminal, a source terminal, and a drain terminal, wherein the gate terminal is coupled to the fifth node, the source terminal is coupled to the ground, and the drain terminal is coupled to the fifth node;
    a fourth N-type transistor, comprising a gate terminal, a source terminal, and a drain terminal, wherein the gate terminal is coupled to the fifth node, the source terminal is coupled to the ground, and the drain terminal generates the first current;
    a second current source, generating a second bias current flowing from the second node to the ground; and
    a third current source, generating a third bias current flowing from the third node to the ground, wherein values of the first bias current, the second bias current and the third bias current are all the same.

18. The integrated circuit as defined in claim 14, wherein the amplifier comprises:
    a first N-type transistor, comprising a gate terminal, a source terminal, and a drain terminal, wherein the gate terminal receives the divided voltage, the source terminal is coupled to a first node, and the drain terminal is coupled to a second node, wherein the first current flows from the first node to a ground;
    a second N-type transistor, comprising a gate terminal, a source terminal, and a drain terminal, wherein the gate terminal receives the feedback voltage, the source terminal is coupled to the first node, and the drain terminal is coupled to a third node;
    a first P-type transistor, comprising a gate terminal, a source terminal, and a drain terminal, wherein the gate terminal is coupled to the second node, the source terminal receives a supply voltage, and the drain terminal is coupled to the second node;
    a second P-type transistor, comprising a gate terminal, a source terminal, and a drain terminal, wherein the gate terminal is coupled to the second node, the source terminal receives the supply voltage, and the drain terminal is coupled to a fourth node;
    a third P-type transistor, comprising a gate terminal, a source terminal, and a drain terminal, wherein the gate terminal is coupled to the third node, the source terminal receives the supply voltage, and the drain terminal is coupled to the third node;
    a fourth P-type transistor, comprising a gate terminal, a source terminal, and a drain terminal, wherein the gate terminal is coupled to the third node, the source terminal receives the supply voltage, and the drain terminal is coupled to a fifth node;
    a third N-type transistor, comprising a gate terminal, a source terminal, and a drain terminal, wherein the gate terminal is coupled to the fourth node, the source terminal is coupled to the ground, and the drain terminal is coupled to the fourth node; and
    a fourth N-type transistor, comprising a gate terminal, a source terminal, and a drain terminal, wherein the gate terminal is coupled to the fourth node, the source terminal is coupled to the ground, and the drain terminal is coupled to the fifth node.

19. The integrated circuit as defined in claim 18, wherein the dynamic resistance comprises:
    a fifth N-type transistor, comprising a gate terminal, a source terminal, and a drain terminal, wherein the gate terminal is coupled to the fifth node, the source terminal is coupled to the ground, and the drain terminal is coupled to the feedback voltage, wherein the first control signal is generated at the fifth node.

20. The integrated circuit as defined in claim 14, wherein the amplifier comprises:
    a first N-type transistor, comprising a gate terminal, a source terminal, and a drain terminal, wherein the gate terminal is coupled to a first node, the source terminal is coupled to a ground, and the drain terminal is coupled to the first node;
    a second N-type transistor, comprising a gate terminal, a source terminal, and a drain terminal, wherein the gate terminal is coupled to the first node, the source terminal is coupled to the ground, and the drain terminal is coupled to a second node;
    a first P-type transistor, comprising a gate terminal, a source terminal, and a drain terminal, wherein the gate terminal receives the divided voltage, the source terminal is coupled to a third node, and the drain terminal is coupled to the first node, wherein the third node receives the second current; and
    a second P-type transistor, comprising a gate terminal, a source terminal, and a drain terminal, wherein the gate terminal receives the feedback voltage, the source terminal is coupled to the third node, and the drain terminal is coupled to the second node;
    wherein the second N-type transistor acts as the dynamic resistor, and the second node is coupled to the feedback voltage.

* * * * *